United States Patent [19]

Kato et al.

[11] Patent Number: 4,906,941

[45] Date of Patent: Mar. 6, 1990

[54] DIGITAL PHASE LOCKED LOOP CIRCUIT

[75] Inventors: Masaaki Kato; Yasuyoshi Nishikawa, both of Kawasaki, Japan

[73] Assignee: Kabushiki Kaisha Toshiba, Kawasaki, Japan

[21] Appl. No.: 259,902

[22] Filed: Oct. 19, 1988

[30] Foreign Application Priority Data

May 25, 1988 [JP] Japan .................. 63-125820

[51] Int. Cl.$^4$ .......................... H03D 3/24; H04L 7/04
[52] U.S. Cl. ....................................... 328/155; 328/72; 375/120
[58] Field of Search .................... 328/155, 55, 133, 63, 328/72, 151; 307/262, 511, 529, 269; 375/81, 82, 111, 118, 119, 120

[56] References Cited

U.S. PATENT DOCUMENTS 4,584,695  4/1986  Wong et al. ............................ 375/81
4,715,050  12/1987  Tanaka et al. ...................... 328/155

FOREIGN PATENT DOCUMENTS 5992410  5/1984  Japan .

OTHER PUBLICATIONS

IEICE Technical Report EA82-59; "A Data Detection Method for a Stationary Head Digital Tape Recorder"; Sugita et al.; 1982.

Sharp Technical Journal, vol. 34, "Development of Digital Multiplexing Method for Stationary Digital Audio Tape Recording System", M. Takeuchi et al., 1986.

IEICE Technical Report EA86-9, "A Stationary Head Digital Audio Tape Recorder", T. Iwaki et al.; 1986.

Primary Examiner—Stanley D. Miller
Assistant Examiner—Timothy P. Callahan
Attorney, Agent, or Firm—Oblon, Spivak, McClelland, Maier & Neustadt

[57] ABSTRACT

A digital phase locked loop circuit samples the reproduced analog signal of a digital signal at a sampling frequency larger than the bit rate of the digital signal, and arithmetically operates, by using data at a plurality of successive sampling points, an average phase of the reproduced signal in the range from a point where the reproduced signal crosses a reference level to a predetermined sampling point, and makes the phase locked loop control of the reproduced signal by using the operated average phase.

19 Claims, 13 Drawing Sheets

DIGITAL PHASE LOCKED LOOP CIRCUIT

BACKGROUND OF THE INVENTION

1. Field of the Invention

The present invention relates to a digital phase locked loop circuit which employs digital processing elements to achieve the phase locked looping function. More particularly, the present invention relates to digital phase locked loop circuit which is well adaptable for reading out digital signals from a transmission system, for example, when the digital signal is reproduced in a recording/reproduction apparatus or when the digital signal is received in the data transmission system.

2. Description of the Related Art

There has been known a magnetic recording/reproduction apparatus of the type using magnetic recording medium, such as a magnetic tape or a magnetic disk, for digital signal recording and reproduction. In this type of the apparatus, to discriminately reproduce the original digital signal from the signal as read out of the recording medium, a clock signal must be used whose frequency corresponds exactly to the bit rate of the read out signal. To obtain such a clock signal, a phase locked loop circuit (PLL) is generally used to pick up it from the read out signal. The conventional PLL circuit has been of the analog type using, for example, a voltage controlled oscillator.

Magnetic recording/reproduction apparatuses operating at low data rate have been proposed. An exemplar of such apparatuses is a multi-track digital audio tape recorder of the stationary head type, which is now under development. For example, a digital PLL circuit for use in such apparatuses is disclosed by Junkichi Sugita et al., in their Japanese patent Disclosure No. 59-92410, and this digital PLL circuit is suitable for IC (integrated circuit) fabrication. Substantially the same technique as that of the above patent gazette is also proposed by Junkichi Sugita et al., "A Data Detection Method for a Stationary Head Digital Tape Recorder", IEICE Technical Report, EA82-59, pp. 33-40, 1982, and by Tetsuo Iwaki et al., "A Stationary Head Digital Audio Tape Recorder", IEICE Technical Report, EA86-9, pp. 41-48, 1986.

A block diagram shown in FIG. 1 schematically represents a configuration of the conventional digital PLL circuit disclosed in the above patent gazette by Sugita et al. A waveform shown in FIG. 2 is useful in explaining the operation of the FIG. 1 circuit.

In FIG. 1, a reproduced signal Rs is applied to input terminal 100. The reproduced signal Rs, an analog signal, has a history that in a magnetic recording/reproduction apparatus, a signal read out by a reproduction head (not shown) is amplified by a preamplifier, and is wave-equalized by an equalizer circuit. When the channel data rate of the recorded and reproduced signal is f bit/sec, 2f Hz or more suffices for the sampling frequency. Also in FIG. 1, the sampling frequency in A/D converter 101, which is for A/D converting the reproduced signal Rs, is selected to be two times the channel data rate. The sampling frequency is determined by a sampling clock signal derived from sampling clock generator 102. The signal Rs applied to input terminal 101 is sampled and converted into discrete values $S_i$ ($i=1, 2, \ldots$), or a series of digital data $S_1, S_2, S_3, \ldots, S_i, \ldots$ as shown in FIG. 2. The data $S_i$ is output in parallel from A/D converter 101, each consisting of M bits (M=positive integer). In the illustration of FIG. 1, the output of A/D converter 101 is illustrated by a single line, for simplicity. The digital data Si is applied to D-type flip-flop (FF) 103, phase operation circuit 104 and zero-cross detector 105. FF 103 delays digital data Si by one sampling period. The output signal from D-type FF 103 is applied to phase operation circuit 104 and zero-cross detector 105. When a zero-cross point exists between sampling points $S_i$ and $S_{i+1}$, phase operation circuit 104 calculates a phase difference $\theta_i$ between the zero-cross point and the sampling point of data $S_{i+1}$ by using the input data $S_i$ and $S_{i+1}$. More specifically, for the calculation, the curve ranging between points $S_i$ and $S_{i+1}$ is linear approximated, and the phase angle of 360° is expressed by $2_n$. That is to say, the circuit 104 operates the following relation $$\theta_i = \frac{|S_{i+1}|}{|S_i| + |S_{i+1}|} \times 2^{n-1} \tag{1}$$

where $|S_i|$ and $|S_{i+1}|$ are absolute values of data $S_i$ and $S_{i+1}$. Zero-cross detector 105 detects the zero-cross point between the successive sampling points. The detector 105 decides that when the signs of the successive data, for example, $S_i$ and $S_{i+1}$ are different, the zero-cross point exists between them. The output data signals from phase operation circuit 104 and zerocross point detector 105 are respectively applied to FFs 106 and 107, and latched therein. The data signal output from FF 106 and representing the phase angle $\theta_i$ in formula (1), is applied to subtractor 108. Subtractor 108 subtracts the output data signal $\theta_0$ of adder 109 from $\theta_i$. The data signal from subtractor 108 is applied to coefficient multiplier (referred to as a K-multiplier) 110. The K-multiplier 110 multiplies the received data signal by coefficient K($0 < K \leq 1$), and produces data signal represented by K($\theta_i$-$\theta_0$). The data signal of K($\theta_i$-$\theta_0$) is applied to AND gate 111. AND gate 111 is enabled by the signal from D-type FF 107, and allows the K($\theta_i$-$\theta_0$) data signal to pass therethrough. When the zero-cross point is detected, since the $\theta_i$ of formula (1) represents the phase of data $S_{i+1}$, AND gate 111 is enabled and the output data K($\theta_i$-$\theta_0$) of multiplier 110 applied to adder 112. When the zero-cross point is not detected, since the $\theta_i$ of formula (1) does not represent the phase of data $S_{i+1}$, AND gate 111 is disabled and 0 is applied to adder 112. Thus, a circuit section including subtractor 108, multiplier 110 and AND gate 111 functions like the phase comparator and the loop filter of the normal analog PLL circuit.

Adder 112 adds the data output signals from AND gate 111 and adder 109, and applies the addition result to FF 113. The output data signal from FF 113 is supplied to adder 109. Adder 109 also receives fixed data of $2^{n-1}$ from $2^{n-1}$ generator 114. Another circuit section made up of adders 109 and 112, D-type FF 113, and $2^{n-1}$ generator 114 functions like the voltage controlled oscillator of the analog PLL circuit. This circuit section operates such that the phase of the output signal of D-type FF 113 rotates 360° at the frequency, which is ½ the sampling frequency of sampling clock generator 102, viz., equal to the channel data rate, and that the phase of that output signal is controlled by the input signal of AND gate 111 to adder 2. The clock signal of sampling clock generator 102 is applied to D-type FFs 103, 106, 107 and 113. The digital PLL circuit, thus arranged, includes both elements serving as a phase comparator and a loop filter and elements serving as a voltage-controlled oscillator, and therefore produces a signal which is phase-locked with the digital data output from A/D converter 101. The signal delay of this digital PLL circuit is a total of the delays of adder 109, subtractor 108, multiplier 110, AND gate 111, adder 112, and D-type FF 113. The upper operating frequency of the PLL circuit is limited by the delay time of the PLL. One may make the speed-up of the PLL circuit in such a way that the coefficient K of K-multiplier 110 is $\frac{1}{2}l$ (l=positive integer) and the delay time of multiplier 11 is zeroed by digit shifting, and the inversion of the most significant digit is substituted for adder 109 and $2^{n-1}$ generator 114. In this case, even if the improved PLL circuit is constructed with the present TTL IC, with n=8, the upper limit of the operating frequency of that circuit is at most 30 MHz for the sampling frequency. Accordingly, the digital PLL circuit based on the present TTL is applicable only for the magnetic recording/reproduction apparatus whose channel data rate is 15 M bits/sec or smaller.

In the conventional digital PLL circuit of FIG. 1, the loop filter substantially consists of only K-multiplier 110. Therefore, the loop gain of the circuit is small, and hence a stationary phase error is large. To reduce the stationary phase error, a leak integrator may be used for K-multiplier 110. Use of the leak integrator increases the loop gain in low frequency regions. However, the leak integrator complicates a circuit arrangement of the loop filter included circuit. This results in increase of the signal delay in the phase locked loop, and decrease of the operating frequency.

As described above, the prior digital PLL circuit has the following problems.

(1) Since the tolerable channel data rate must be set to be low, the PLL circuit is applicable for only those magnetic recording/reproduction apparatuses operating at low channel data rate.

(2) To increase the operating frequency, one may simplify the loop filter. This approach, however, results in increase of the stationary phase error. To cope with this phase error increase, one may modify the PLL circuit to increase the loop gain in low frequencies. This additional approach brings about a complicated circuit arrangement, and hence reduces the operating frequency of the PLL circuit.

SUMMARY OF THE INVENTION

Accordingly, an object of the present invention is to provide a digital phase locked loop circuit capable of processing data signal with a high bit rate.

Another object of the present invention is to provide a digital phase locked loop circuit capable of reducing the stationary phase error without decreasing the operating frequency.

In a phase locked loop circuit arranged on the basis of a first aspect of the present invention which is for solving the above first problem, an average phase for a time period consisting of a plurality of sampling intervals are operated in parallel by using the data on three or more sampling points. The phase correction is performed by the phase locked loop circuit at time intervals each consisting of the plurality of sampling intervals. The first aspect of the present invention increases the operating frequency of the phase locked loop, and hence solves the above first problem. The average phase over the time period consisting of the plurality of sampling intervals defined by the sampling points is calculated on the basis of the sums of the absolute values of the sampling data at both ends of the sampling interval containing a zero-cross point, and the absolute values of one of the sampling data. More specifically, the sums and the absolute values of one sampling data are averaged over the time period consisting of the plurality of intervals, and the average of absolute values is divided by the average of sums.

In a phase locked loop circuit arranged on the basis of a second aspect of the present invention, the phase error component distributed in the low frequencies is subjected to a correction process in which a stationary phase error is reduced, such as the leak integration. This process is performed outside the phase locked loop. Thus, the phase error component is input to the phase locked loop circuit after it is corrected. The phase locked loop circuit uses a simple loop filter, ensuring a high operating frequency.

The phase locked loop circuit based on the first aspect of the present invention does not require a feedback loop for arithmetically operating the average phase for the plurality of sampling intervals. With the simple adding operation of the phase data performed in parallel, the pipeline processing is allowed for the averaging operation. Therefore, the phase locked loop circuit is operable in a high speed. Originally, the phase locked loop circuit averages instantaneous phases of an input signal. This implies that if the phase is corrected at time intervals each defined by a plurality of sampling points, by using the average phase for the plurality of sampling intervals, the phase locked loop circuit could be operable at the sampling frequency higher than the frequency as determined by the delay time of the phase locked loop. Actually, a digital phase locked loop circuit based on the first aspect of the present invention was constructed with the circuit elements comparable with those of the prior phase locked loop circuit. The phases were averaged over the period of eight sampling intervals. The operation speed of the phase locked loop circuit was improved up to about 200 MHz of the sampling frequency. This fact explicitly shows that the phase locked loop circuit based on the first aspect of this invention is applicable for magnetic recording/reproduction systems of a high channel data rate.

As mentioned above, the digital phase locked loop circuit of the first aspect arithmetically operates the average phase for the predetermined number of sampling points, which define a plurality of the successive sampling intervals, and corrects the phase of the phase locked loop at time intervals each consisting of a plurality of sampling points, by using the calculated average phase. This phase locked loop circuit is operable at the sampling frequency two times or more the frequency determined by the delay time of the phase locked loop. Therefore, it is suitably applicable for high speed, digital magnetic recording/reproduction apparatuses, such as digital VTRs (video tape recorders).

In a phase locked loop circuit based on the second aspect of the present invention, the low frequency components of the phase error is calculated outside the phase locked loop, to correct the phase. Consequently, the stationary phase error may be reduced without decreasing the operating frequency of the phase locked loop circuit.

According to the phase locked loop circuit based on the second aspect of the invention, the stationary phase error can be reduced not impairing the operating frequency performance. The phase locked loop circuit is suitably applicable for high speed, digital magnetic recording/reproduction apparatuses, such as digital VTRs (video tape recorders).

DETAILED DESCRIPTION OF THE PREFERRED EMBODIMENTS

Some specific embodiments of a phase locked loop (PLL) circuit according to the present invention will be described referring to the accompanying drawings.

Figure 3:
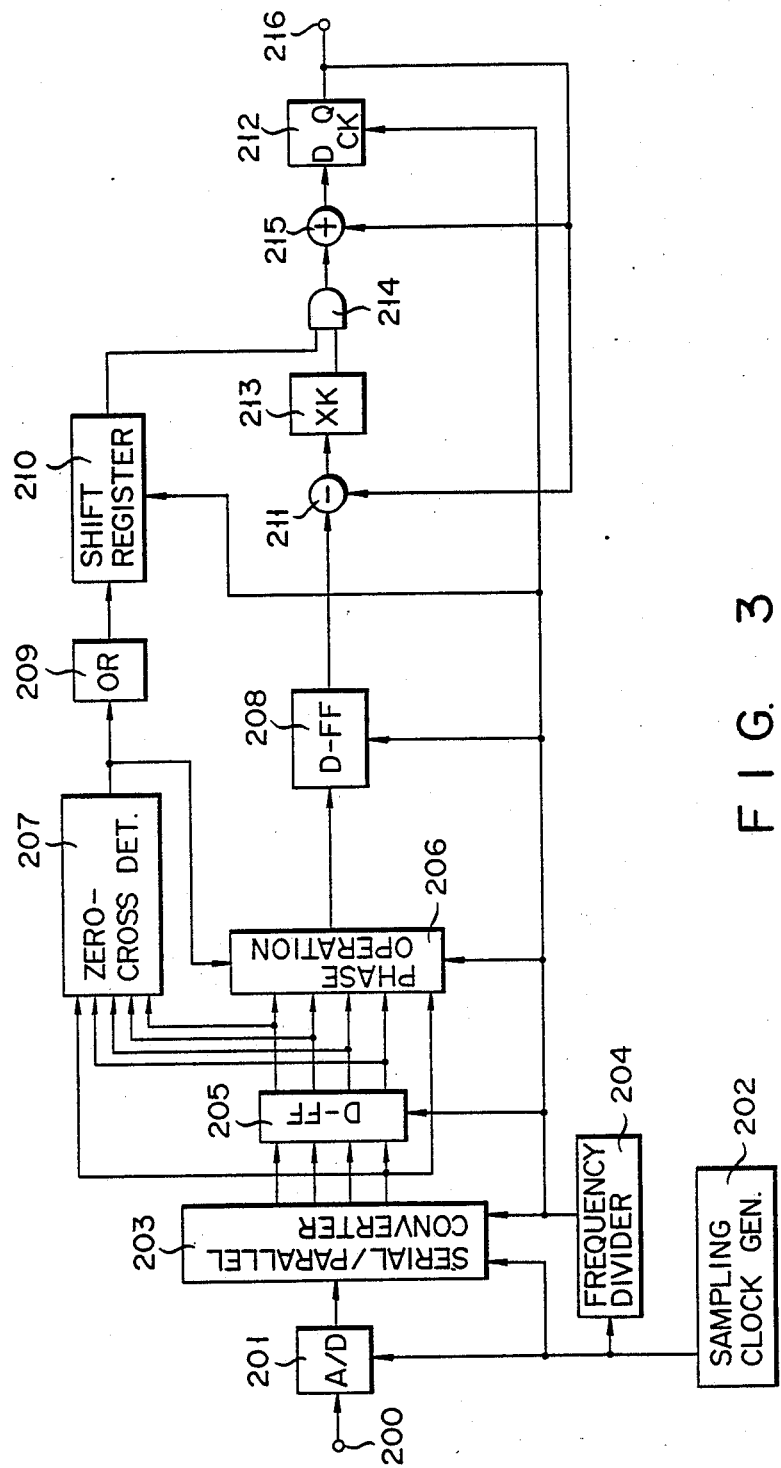
FIG. 3 shows a block diagram showing a configuration of a digital phase locked loop circuit according to a first embodiment of the present invention.

A first embodiment of a PLL circuit, which is based on the first aspect of the present invention, is schematically illustrated in FIG. 3. The PLL circuit arithmetically operates an average phase of an input signal for a time period of four sampling intervals as defined by successive five sampling points, and corrects the phase every four sampling points, by using the calculated average phase.

Figure 1:
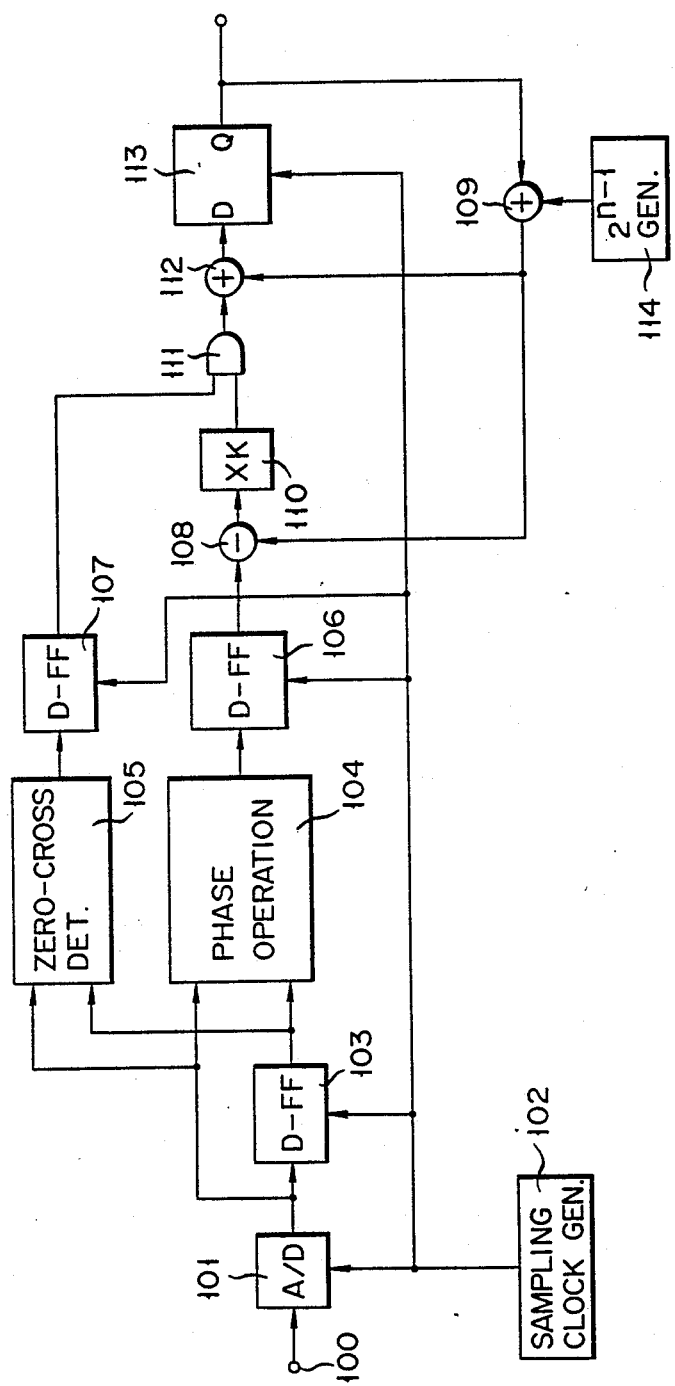
FIG. 1 shows a block diagram showing a configuration of a conventional digital phase locked loop circuit.
Figure 2:
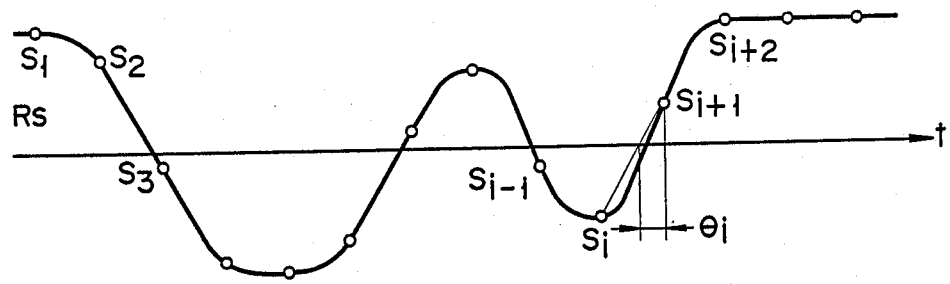
FIG. 2 shows a waveform useful in explaining the operation of the FIG. 1 circuit.
Figure 4:
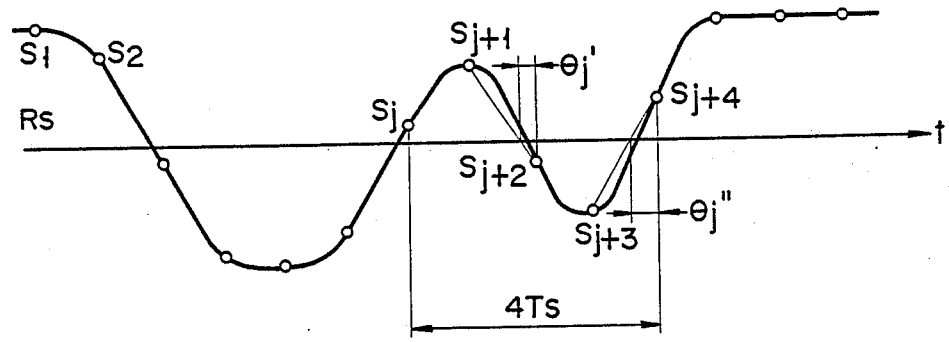
FIG. 4 shows a waveform useful in explaining the operation of the FIG. 3 circuit.

In the schematic illustration of the PLL circuit followed by FIG. 4 showing a waveform for explaining its operation, a reproduced signal Rs is applied to input terminal 200. The reproduced signal Rs, like that applied to terminal 100 in FIG. 1, is an analog signal with a history that the signal as read out by a reproduction head (not shown), is amplified by a preamplifier, and is wave-equalized by an equalizer circuit. The input analog signal Rs is applied to A/D converter 201. The converter 201 receives a clock signal from sampling clock generator 202. The frequency of the clock signal from sampling clock generator 202 is two times a channel data rate. The signal Rs applied is sampled according to the sampling clock signal, and converted into a series of digital data $S_1, S_2, S_3, \ldots, S_j, S_{j+1}, S_{j+2}, \ldots$, or digital data $S_j (j=1, 2, \ldots)$, as shown in FIG. 4. The data $S_j$ are output in parallel and each consist of M bits (M=positive integer). In the illustration of FIG. 3, the output of A/D converter 201 is illustrated by a single line, for simplicity. The A/D converted digital data $S_j$ is applied to serial-to-parallel converter 203. In the converter, it is converted such that successive four data (i.e., time sequentially arranged four data) are output in parallel. Serial-to-parallel converter 202 is cotrolled by the sampling clock signal from sampling clock generator 202, and a fs/4 clock signal supplied from frequency divider 204. The fs/4 clock signal is obtained by frequency-dividing the sampling clock signal by 4. The parallel data are delayed by a 4-sampling period by D-type FF 205. Of the four pieces of data output in parallel from serial-to-parallel converter 203, only the data sampled at the first sampling point, viz., the data first sampled, is directly applied to phase operation circuit 206 and zero-cross detector 207. The parallel data derived from D-type FF 205 are applied to phase operation circuit 206 and zero-cross detector 207.

Phase operation circuit 206 operates an average phase for a time period of four sampling intervals 4Ts as defined by five successive sampling points $S_j$, $S_{j+1}$, $S_{j+2}$, $S_{j+3}$, and $S_{j+4}$, as shown in FIG. 4. More exactly, phase operation circuit 206 obtains the average phase by averaging the phase in the sampling interval, which exists between two successive sampling point and includes a zero-cross point. The zero-cross point is detected by zero-cross point detector 207. In the case of five sampling points as shown in FIG. 4, the average phase $\theta_j$ for odd-numbered sampling points $S_j$, $S_{j+2}$, and $S_{j+4}$ is given by $$\theta_j = (\theta_j' + \theta_j'')/2 \qquad (2)$$

$$= \left\{ \frac{|S_{j+2}|}{|S_{j+1}| + |S_{j+2}|} 2^{n-1} + \frac{|S_{j+4}|}{|S_{j+3}| + |S_{j+4}|} 2^{n-1} \right\}/2$$

Approximating the above relation (2) on the assumption that $\theta_j' \approx \theta_j''$, we have $$\theta_j \approx \{(|S_{j+2}| + |S_{j+4}|)/(|S_{j+1}| + |S_{j+2}| + |S_{j+3}| + |S_{j+4}|)\}2^{n-1} \qquad (3)$$

In the digital arithmetic operation, division is generally more complicated than addition and multiplication. Therefore, for the phase operation, the approximate relation (3) is better than the relation (2). That is to say, the relation (3) allows use of simpler hardware and higher speed operation. Further, a pipeline process can be used for the operation of the relations (2) and (3). Therefore, if the number of input data is increased, the pipeline process is available and hence the data may be processed at a high speed. Since the value resulting from the relation (3) is an approximate value, it is necessarily attendant with an error. Both the relations (2) and (3) are based on the linear approximation of the phase between two successive sampling points, and therefore the calculation results of them inevitably involve a phase error. The phase error by the relation (3) is comparable with that due to the linear approximation, and is negligible in practical use. Phase operation circuit 206 responds to a signal from zero-cross detector 207, and adds or averages the sums of the absolute values of the sampling data at both ends of the sampling interval containing a zero-cross point, which is contained in the four sampling intervals, and further the absolute values of the sampled data at one end of the zero-cross point included sampling interval, over the time period of the four sampling intervals. Further, the phase operation circuit 206 calculates a ratio of the two types of the added values or the average values, to approximate an average phase over the period of the four sampling periods.

The output data signal of phase operation circuit 06 is applied to D-type FF 208. The output data signal of zero-cross detector 207 is applied to shift register 10 via OR circuit 209. The number of stages of shift register 210 is so selected as to compensate for the time taken for the phase operation by the pipeline process. The output data of D-type FF 208 is given by $\theta_j$. Data $\theta_j$ is input to subtractor 211. Subtractor 211 subtracts the output data $\theta_0$ of D-type FF 212 from data $\theta_j$. The subtraction result is applied to K-multiplier 213. The multiplier 213 multiplies the subtraction result by coefficient K ($0 < K \leq 1$), and produces data signal of $K(\theta_j - \theta_0)$. The output data of K-multiplier 213 is applied to AND gate 214. The output signal of OR gate 209 is applied through shift register 210 to AND gate 214, too. AND gate 214 is enabled by the output signal from OR gate 209. When a zero-cross point exists in any of the four sampling intervals defined by five sampling points, OR gate 209 outputs data "1". When no zero-cross point exists, it produces data "0". The output data of OR gate 214 is applied through shift register 214 to AND gate 214. Therefore, when no zero-cross point exists, AND gate 214 produces data "0". The output of AND gate 214 is applied to adder 215. Adder 215 adds the output data of AND gate 214 and the output data $\theta_0$ of D-type FF 212, and applies the sum of the data to D-type FF 212. The output of D-FF 212 is applied as the output data of this digital phase locked loop circuit to output terminal 216. The output signal of frequency divider 204 is applied as a clock signal to D-type FFs 205, 208, and 212, phase operation circuit 206, and shift register 210.

In the digital PLL circuit under discussion, a circuit section including subtractor 211, K-multiplier 213 and AND gate 214 has functions similar to those of the phase comparator and the loop filter of the analog PLL circuit. Another circuit section including adder 215 and D-type FF 212 corresponds in function to the voltage controlled oscillator of the analog PLL circuit. In the digital PLL circuit, after the digital data from A/D converter 201 is converted into parallel data by serial-to-parallel coverter 201, the digital data is processed by the circuit operating at the frequency of fs/4 cock signal, which is ¼ of the sampling frequency fs. For example, the digital PLL circuit of FIG. 3 was manufactured by using a TTL IC for the portion other than A/D converter 201, sampling clock generator 202, serial-to-parallel converter 203, and frequency divider 204. The manufactured PLL circuit was operable at a sampling frequency of about 120 MHz. While the FIG. 3 PLL circuit employs four sampling intervals for phase locking control, eight sampling intervals may be used for the same end. In this case, the sampling frequency could be increased to about 240 MHz. The PLL circuit based on the 8 sampling intervals may handle high speed digital signals at 120 M bit/sec of channel bit rate.

As a generalization, any number of sampling points of 3 or more may be used for the average phase calculation. This number may be selected depending on the channel rate of the reproduced signal and/or the delay time of the IC used. The larger the number of the sampling points is, the higher the operation speed of the PLL circuit is. However, with increase of the sampling points, the phase operation is complicated, and a frequency range allowing the PLL control becomes narrower.

In the circuit shown in FIG. 3, a K-multiplier is used as an element corresponding to the loop filter. However, a more complicated element such as an integrator or a leak integrator may be used in place of the K-multiplier. In this case, the stationary phase error may be improved.

The digital PLL circuit according to the first embodiment arithmetically operates the average phase for the period consisting of the plural sampling intervals defined by successive sampling points, and corrects the phase of the input signal in the PLL at intervals each consisting of the plurality of sampling points. Therefore, the PLL circuit is operable at a sampling frequency two times or more a frequency determined by the delay time of the PLL.

The PLL circuit of FIG. 3 may contain a large error in the average phase resulting from the parallel operation, when zero-cross points exist in both even-numbered and odd-numbered sampling intervals of those successive sampling intervals, viz., when the phase at the sampling point contained in those sampling intervals is near $0^0 (2\pi)$ or $\pi$. This error unlocks the phase in the PLL.

The error in the average phase will be discussed referring to FIGS. 5A to 5C.

Let us obtain an average phase for the four sampling intervals including five successive sampled data $S_j$, $S_{j+1}$, $S_{j+2}$, and $S_{j+3}$, which are sampled at the frequency two times the data rate of an input signal. In the case of the sampling at the double frequency of the input signal data rate, the phase between the successive sampling points is x in terms of the bit clock phase. Therefore, the phases of the five sampled data $S_j$, $S_{j+1}$, $S_{j+2}$, and $S_{j+3}$ are divided into two groups, one consisting of $S_j$, $S_{j+2}$, and $S_{j+4}$ and the other consisting of $S_{j+1}$ and $S_{j+3}$. The average phase operation is applied to either of the above two groups. For the group of $S_{j+1}$ and $S_{j+3}$, the average phase for the four sampling intervals is operated on the assumption that the phase at the zero-cross point is zero.

Figure 5A:
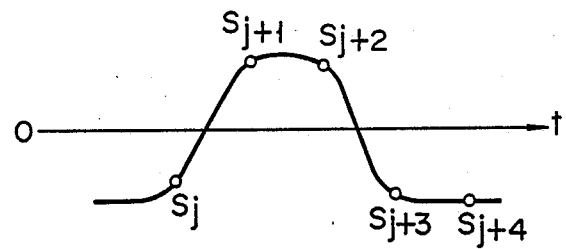
FIGS. 5A to 5E show a set of waveforms for explaining the disadvantages of the FIG. 3 circuit.
Figure 5B:
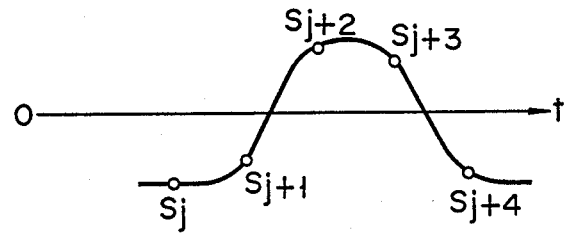

When the data rate of the input signal has a predetermined value, the zero-cross points in the four sampling intervals are as shown in FIGS. 5A and 5B. In the case of the FIG. 5A, when using the algorithm expressed by relation (3) for obtaining the average phase (referred frequently to an average phase algorithm), average phase $\theta_1$ may be expressed by $$\theta_1 = \{(|S_{j+1}| + |S_{j+3}|)/(|S_j| + |S_{j+1}| + |S_{j+2}| + |S_{j+3}|)\} \times \pi$$

The value of $\theta_1$ indicates a proper average phase.

In the case of FIG. 5B, average phase $\theta_2$ may be expressed by $$\theta_2 = \{(|S_{j+2}| + |S_{j+4}|)/(|S_{j+1}| + |S_{j+2}| + |S_{j+3}| + |S_{j+4}|)\} \times \pi + \pi$$

This calculation result shows that some measure must be taken for compensating for $\pi$.

Figure 5C:
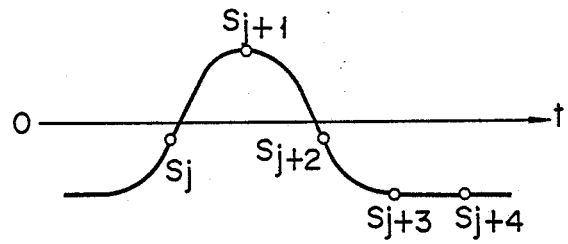

When the data rate is deviated from its original one due to jitter, for example, there are cases that the zerocross points exist in the four sampling intervals, as shown in FIG. 5C. The average phase $\theta_3$ in the FIG. 5 case is given $$\theta_3=\{(|S_{j+1}|+|S_{j+2}|)/(|S_j|+|S_{j+1}|+|S_{j+1}|+|S_{j+2}|)\}\times\pi$$

This calculated value indicates approximately $\pi/2$. As seen from FIG. 5C, however, the actual average phase is near $\pi$, and including an error of about $\pi/2$.

In a waveform of FIG. 5D, the average phase $\theta_4$ may be calculated as below $$\theta_4=\{(|S_{j+1}|+|S_{j+4}|)/(|S_j|+|S_{j+1}|+|S_{j+3}|+|S_{j+4}|)\}\times\pi$$

The calculation result indicates approximately $\pi/2$. Actually, however, the average phase is near 0 ($2\pi$), causing an error of $+\pi/2$.

Figure 5D:
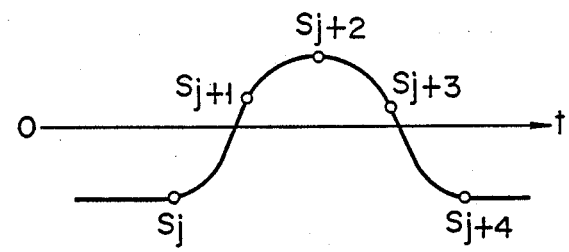
Figure 5E:
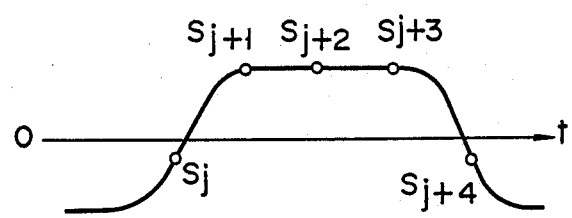

In the case of FIG. 5E, the sampling interval containing the zero-cross point is substantially equal to that of the FIG. 5D case. But the position of the zerocross point is different from that of the FIG. 5D case. The calculated average phase of the FIG. 5E case is approximately $\pi/2$, which is equal to $\theta_4$. The actual phase is approximately $\pi$, and includes an error of approximately $-\pi/2$.

As seen from the foregoing, when the data rate of an input signal fluctuates, the calculation result based on the relation (3) inevitably includes a great error. Further, the error frequently has a different direction for the same sampling interval having the zero-cross point.

To cope with this problem, another digital PLL circuit is proposed as a second embodiment of the present invention.

The digital PLL circuit according to the second embodiment is based on the following technical idea. In the idea, an average phase is arithmetically operated in parallel over a time period consisting of a plurality of successive sampling intervals. The number and the position of the sampling interval including a zero-cross point (which indicate what sampling interval includes a zero-cross point) are obtained. The data values of the sampling points at both ends of the zero-cross point included sampling interval are obtained. For the plurality of sampling intervals, a proper phase correction value is selected from the predetermined phase correction values, on the basis of those calculated values. The average phase obtained by the average phase algorithm is corrected by the selected correction value.

Figure 6:
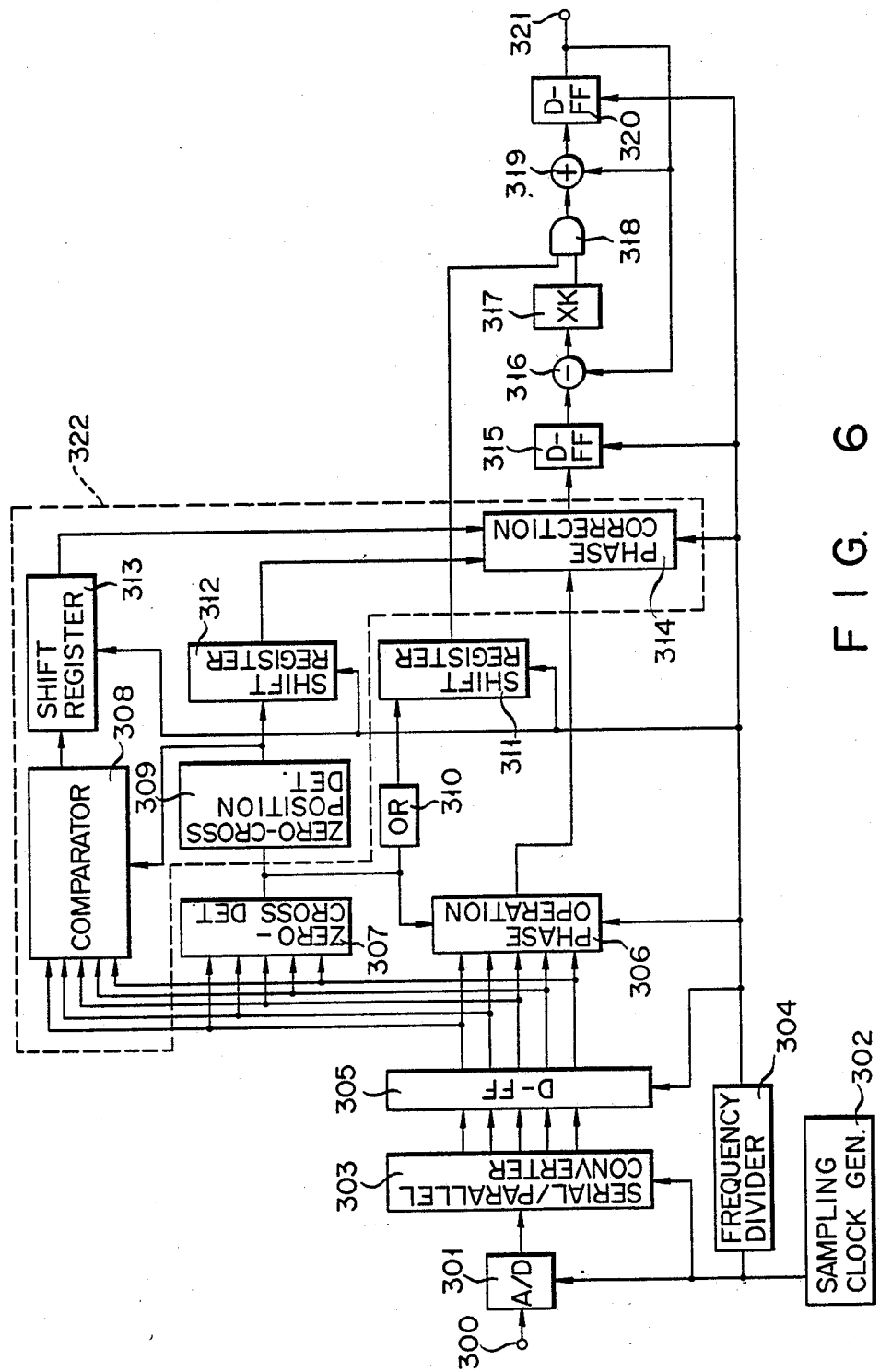
FIG. 6 shows a block diagram showing a configuration of a digital phase locked loop circuit according to a second embodiment of the present invention.
Figure 7:
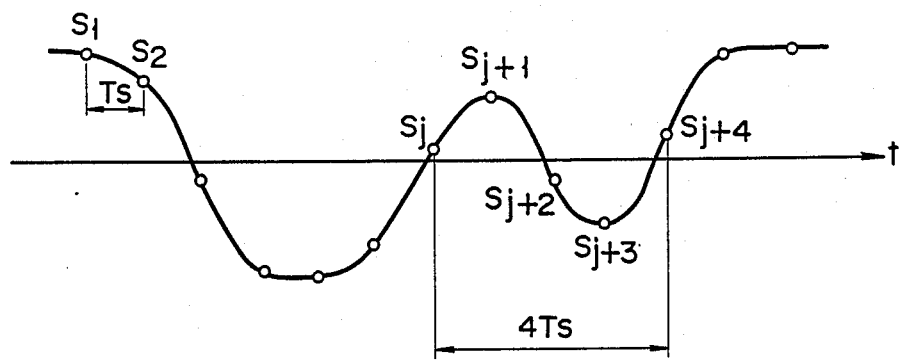
FIG. 7 shows a waveform useful in explaining the operation of the FIG. 6 circuit.

The technical idea may be implemented by a hardware configuration shown in FIG. 6, which is followed by a waveform chart of FIG. 7.

The circuit configuration of FIG. 6 corresponds to the FIG. 3 configuration additionally with a circuit section 322 enclosed by a broken line. In the description to follow, therefore, the emphasis will be placed on the circuit section 322. Also in the FIG. 6 circuit, the sampling clock frequency is two times the channel data rate. The average phase is calculated for four sampling intervals as defined by five sampling points. The phase of the input signal is corrected every four sampling points.

A reproduced signal, for example, is applied to input terminal 300, and subsequently to A/D converter 01. Sampling clock generator 302 generates a sampling clock signal at the frequency two times the channel data rate, and applies it to A/D converter 301. A/D converter 301 converts the received analog reproduced signal Rs into discrete values, i.e., digital data S1, S2, ..., $S_j$, $S_{j+1}$, $S_{j+2}$, $S_{j+3}$, ..., as shown in FIG. 7. Each data consists of M (positive integer) bits, and the M-bit data are to be processed in parallel. Five pieces of successive digital data are converted into a parallel form by serial-to-parallel converter 303, and applied to D-type FF 305. This D-type FF outputs a total of five pieces of data, four pieces of successive data and one piece of data preceding or succeeding to the four pieces of data. Serial-to-parallel converter 303 is controlled by the sampling clock signal from sampling clock generator 302. D-type FF 305 is controlled by a fs/4 clock signal from frequency divider 304. The fs/4 clock signal has the frequency $\frac{1}{4}$ the sampling clock signal frequency fs. The five parallel data derived from D-type FF 305 are applied to phase operation circuit 306, zero-cross point detector 307, and sampled value comparing circuit 308. Phase operation circuit 306 operates an average phase for the four sampling intervals as defined by five sampling points $S_j$, $S_{j+1}$, $S_{j+2}$, $S_{j+3}$, and $S_{j+4}$, by using the data at those sampling points. Under control of a control signal from zero-cross point detector 307, phase operation circuit 306 adds or averages the sums of the absolute values of the sampled data at both ends of the sampling interval including a zero-cross point and the absolute values of the sampled data at the sampling points defining the four sampling intervals, over the time period consisting of the four sampling intervals. Further, phase operation circuit 306 makes a ratio of the two types of addition results or the average values. In this way, the circuit 306 approximates the average phase of the input signal for the four sampling intervals.

Figure 8A:
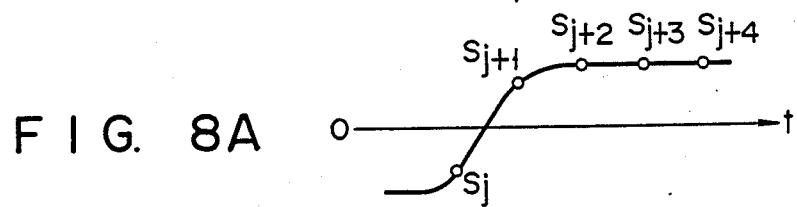
FIGS. 8A to 8L show a set of waveforms for explaining the operation of the FIG. 6 circuit.
Figure 8B:
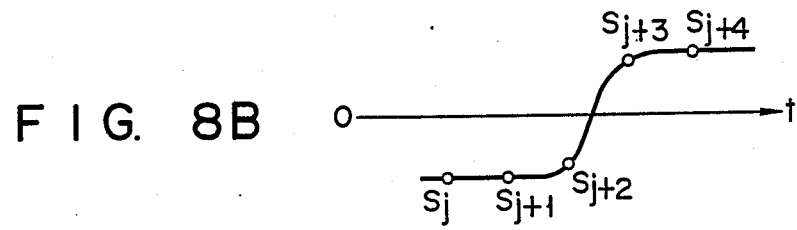
Figure 8C:
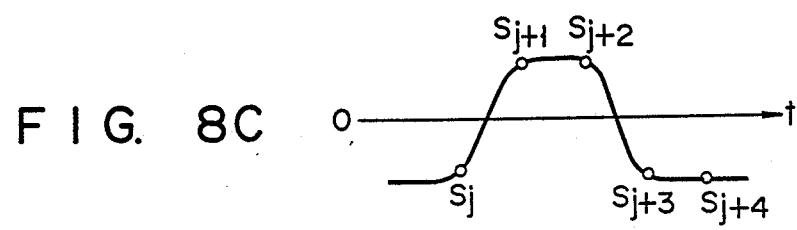
Figure 8D:
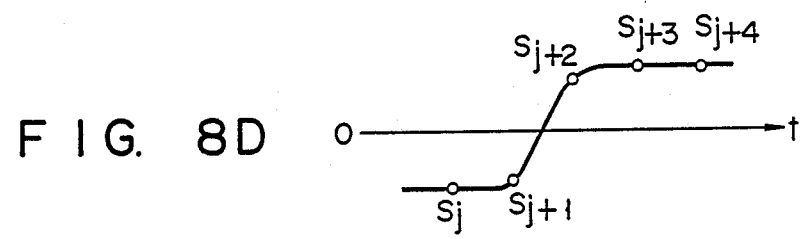
Figure 8E:
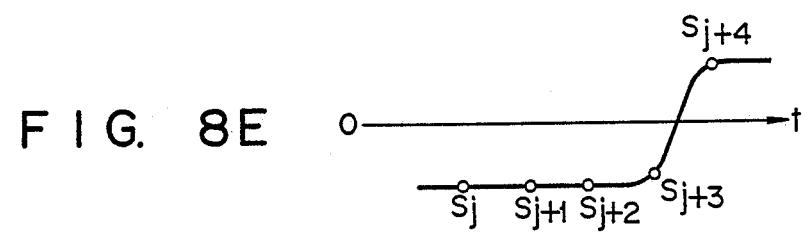
Figure 8F:
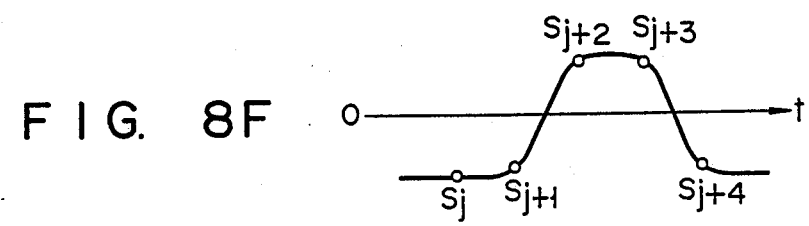
Figure 8G:
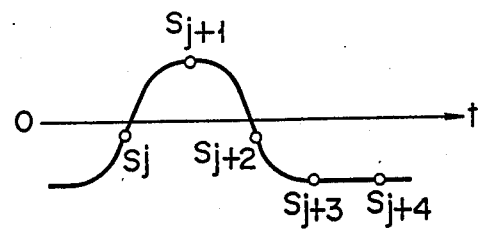
Figure 8H:
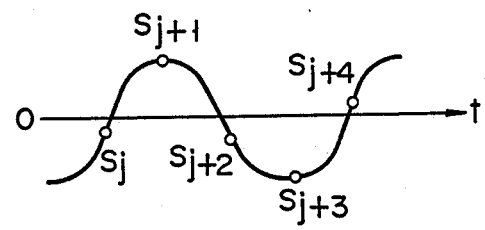
Figure 8I:
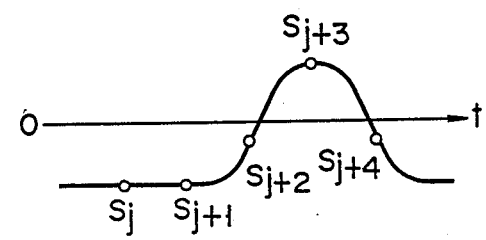
Figure 8J:
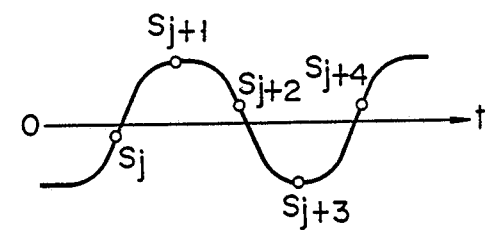
Figure 8K:
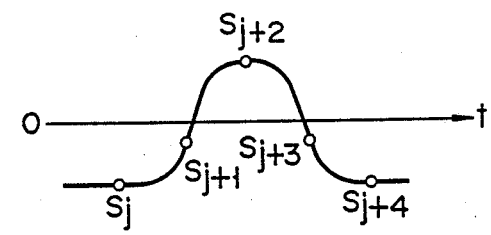
Figure 8L:
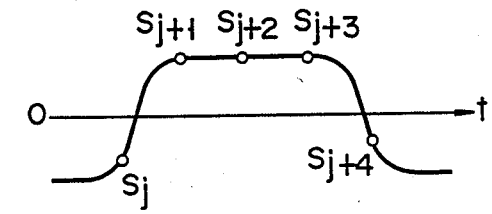

When the input signal to input terminal 300 contains a jitter or the data rate of the input signal is deviated from its original value, the number and the position of the zero-cross point contained in the four successive sampling intervals may come in 12 varieties shown in FIGS. 8A to 8L. Since the sampling frequency is two times the input signal data rate, a phase difference of $2\pi$ exists between the two successive sampling points. Let us obtain the average phase for the sampling points $S_{j+1}$ and $S_{j+3}$ of those five sampling points, with the phase at the zero-cross point being zero. In the varieties of FIGS. 8A to 8C, the calculation result obtained by the average phase algorithm is straight forwardly available for the intended or real average phase. In the varieties of FIGS. 8D and 8E, the relationship between the sampling frequency and the data rate requires the calculation result plus $\pi$ for the real average value. In the varieties of FIGS. 8G to 8J, the zero-cross point exists between the successive sampling points. The real average value is near $\pi$, and equal to the calculated value plus $\pi/2$. Also in the case of FIG. 8K, the zero-cross point exists between the successive sampling points. The real average phase is 0 ($2\pi$), and is equal to the result of (calculated value $-\pi/2$). In the case of FIG. 8L, the average phase is near $\pi$ or 0 ($2\pi$) depending on what sampling interval contains the zero-cross point. Therefore, this case compares the absolutes of the sampling data at the both ends of the sampling interval including the zero-cross point. When the comparison result is $|S_j|\leq|S_{j+1}|$ (or $|S_{j+3}|\geq|S_{j+4}|$), the real average phase is the calculated value plus $\pi/2$. When $|S_j|>|S_{j+1}|$ (or $|S_{j+3}|<|S_{j+4}|$), the real average phase is the result of (calculated value $-\pi/2$). Only four values 0, $\pi$, $\pi/2$ and $-\pi/2$ are satisfactory for the correction values which are applied to the calculated values obtained by the average phase algorithm. To obtain a correct average phase, a proper correction value is selected from those four correction values depending on the number and the position of the zero-cross point contained in the four sampling intervals, and the result of comparison of the absolute values at the both ends of the zero-cross point contained sampling interval. The selected correction value is applied to the calculated value by the average phase algorithm.

The correction of the calculated value is performed in the circuit section 322 in the FIG. 6 PLL circuit. The output signal of zero-cross detector 307 is applied to zero-cross point position detector 309. This detector 309 detects the number and the position of the zerocross point contained in the four sampling intervals. Sampled value comparator 308 compares the necessary sampled values under control of zero-cross point detector 309. The output signals of zero-cross point position detector 309 and the compared sampled value of comparator 308 are applied respectively through shift registers 312 and 313 to phase corrector 314. In phase corrector 314, a correction value is properly selected from the above four correction values, and is added to the output data, i.e., the calculated value, of phase operation circuit 306, thereby correcting the calculated value resulting from the average phase algorithm. The number of stages of each of the shift registers 312 and 313 is selected so as to compensate for the time taken for the pipeline process by phase operation circuit 306.

With such a simple arrangement of the PLL circuit, the calculated value by the average phase algorithm may properly be corrected. Thus, the PLL circuit according to the second embodiment may eliminate the large phase error of $\pi/2$, which is inevitably involved in the average phase obtained by the average phase algorithm, and consequently is free from the phase unlocking.

The correct average phase data $\theta_j$ derived from D-type FF 315 is input to subtractor 316. In subtractor 316, $\theta_j - \theta_0$ is performed. $\theta_0$ is the data output from D-type FF 320. The calculation result is applied to K-multiplier 317 (K is a coefficient and within a range $0 < K \leq 1$), from subtractor 316. In K-multiplier 317, $K \times (\theta_j - \theta_0)$ is performed. The calculation result, $K(\theta_j - \theta_0)$, is applied to AND gate 318, from K-multiplier 317. AND gate 318 is enabled by the output signal of OR gate 310 which is applied through shift register 311. When zero-cross point detector 397 detects that a zero-cross point exists in any of the sampling intervals defined by five sampling points, OR gate 310 produces data "1". When no zero-cross point is detected, it produces data "0". AND gate 318, which is under control of the output signal of OR gate 310, produces data "0", when no zero-cross point is detected. The output signal of AND gate 318 is applied to adder 319. In adder 319, the output data of AND gate 318 is added to the output data $\theta_0$ of D-type FF 320. The addition result is input to D-type FF 320. The output data of the D-type FF 320 is output to output terminal 321, as the output signal of the PLL circuit under discussion. The output signal of frequency divider 304 is applied as a clock signal to D-type FFs 305, 315 and 320, phase operation circuit 306, and shift registers 311 to 313.

If in the average phase calculation, the phase value is treated as a negative phase value, the phase correction values may be limited to only $\pi/2$.

In the varieties of FIGS. 8D to 8F, the real average phase $\theta_1$ is the calculation result $+\pi$. Specifically, the real average phase in the FIG. 8F case is $$\theta_1 = \{(|S_{j+2}| + |S_{j+4}|)/(|S_{j+1}| + |S_{j+2}| + |S_{j+3}| + |S_{j+4}|)\} \times \pi + \pi$$

Rearranging the above relation for $\theta_1$, we have $$\theta_1 = \{(-|S_{j+1}| - |S_{j+3}|)/(|S_{j+1}| + |S_{j+2}| + |S_{j+3}| + |S_{j+4}|)\} \times \pi$$

The above relation does not contain the term $+\pi$. From the this example, it is seen that the correction values other than $\pi/2$ are unneeded. Further, as shown in FIG. 8K, when the phase at the sampling point contained in the four sampling intervals have the values on both the sides of the phase 0 ($2\pi$), the average phase $\theta_2$ is expressed by $$\theta_2 = \{(|S_{j+2}| + |S_{j+3}|)/(|S_{j+1}| + |S_{j+2}| + |S_{j+2}| + |S_{j+3}|)\} \times \pi - (\pi/2)$$

If the phase at sampling point $S_{j+1}$ is treated as $-\delta$, although its real value is $(2\pi - \delta)$ where $\delta$ is a very small positive value, the phase correction of $-\pi/2$ is unneeded, as seen from the following relation $$\theta_2 = \{(-|S_{j+1}| + |S_{j+3}|)/(|S_{j+1}| + |S_{j+2}| + |S_{j+2}| + |S_{j+3}|)\} \times \pi$$

This may readily be realized by merely modifying the handling of the sampling data in the average phase operation by phase operation circuit 306 of the FIG. 6 PLL circuit. The conditions for this operation are the same as those in the case of selection of the phase correction values of $\pi$ and $-\pi/2$.

The technical idea of the second embodiment may be extended to a PLL circuit in which the number of sampling intervals for obtaining the average phase is set to be other than four. In this case, the circuit section 322 in the FIG. 6 PLL circuit is modified so as to detect the number and the position of the zero-cross point included sampling interval of those intervals of two or three or five or more, and to compare the absolute values of the sampled values at both ends of the zero-cross point included sampling interval.

As seen from the foregoing description, in the PLL circuit according to the second embodiment, the average phase for the plurality of successive sampling intervals is operated in parallel. The number and the position of the sampling interval including a zero-cross point are obtained. The data values of the sampling points at both ends of the zero-cross point included sampling interval are obtained. For the plurality of sampling intervals, a proper phase correction value is selected from the predetermined phase correction values, on the basis of those calculated values. The average phase obtained by the average phase algorithm is corrected by the selected correction value. The PLL circuit thus arranged may stably execute its PLL function.

Figure 9:
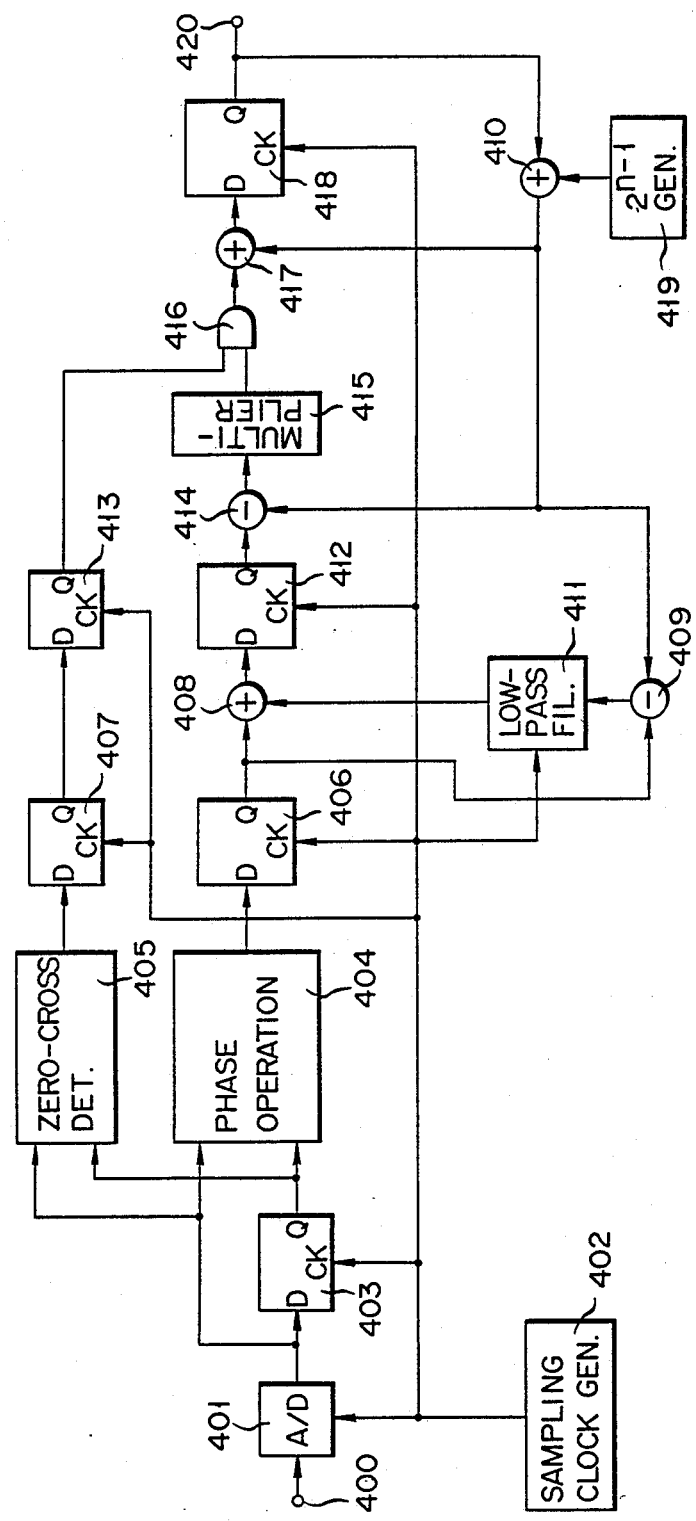
FIG. 9 shows a block diagram showing a configuration of a digital phase locked loop circuit according to a third embodiment of the present invention.

A PLL circuit shown in FIG. 9, as a third embodiment of the present invention, typically implements the second aspect of the present invention.

A reproduced signal Rs is applied to input terminal 400. The reproduced signal Rs, an analog signal, has a history that in a magnetic recording/reproduction apparatus, a signal read out by a reproduction head (not shown) is amplified by a preamplifier, and is wave-equalized by an equalizer circuit. The input signal Rs is applied to A/D converter 401. This converter 401 converts the input signal Rs into discrete values, or a series of digital data $S_1, S_2, S_3, \ldots, S_{i+1}, S_{i+2}, S_{i+3}, \ldots$. The digitized data Si is output in parallel from A/D converter 401, and each consist of parallel M bits (M=positive integer). The digital data is applied to D-type FF 403, phase operation circuit 404 and zero-cross point detector 405. FF 403 delays digital data by one sampling period. The output signal from D-type FF 403 is applied to phase operation circuit 404 and zero-cross detector 405. Phase operation circuit 404 works out a phase of the input signal by using the input data $S_i$ and $S_{i+1}$, according to the relation (1). Zero-cross detector 405 detects the zerocross point between the successive sampling points. The detector 105 decides that when the signs of the successive data, for example, $S_i$ and $S_{i+1}$ are different, the zero-cross point exists between them. The output data signals from phase operation circuit 404 and zerocross point detector 405 are respectively applied to FF 406 and 407, and latched therein. The output data signal of D-type FF 406 is applied to adder 408 and subtractor 409. Subtractor 409 subtracts the output data signal $\theta_0$ of adder 408 from the output data of D-type FF 406, i.e., $\theta_i$ of relation (1). The output data of subtractor 409 is applied to adder 408, through low-pass filter consisting of a leak integrator, for example. The output data of adder 408 is latched in D-type FF 412. The output data of D-type FF 407, or the zero-cross point detect signal of zero-cross point detector 405, is further latched by D-type FF 413, for delay time matching. The output data of D-type FF 412 is applied to subtractor 414. In this circuit 414, the output data $\theta_0$ of subtractor 410 is subtracted from that applied output data. The subtraction result is applied to K-multiplier 415 (K is a constant and within a range of $0<K<1$). The circuit 415 multiplies the subtraction result by K. The output data of K-multiplier 415 is input to AND gate 416. The gating operation of AND gate 416 is controlled by the zero-cross detect signal as the output signal of D-type FF 413. When the zero-cross point is detected, AND gate 416 is enabled to allow the output data of K-multiplier 415 to go to adder 417. Reversely, when it is not detected, the gate is disabled to block the passage of the data signal, producing data "0". Adder 417 adds together the output data of AND gate 416 and adder 410, and applies the addition result to D-FF 418. The output data of D-type FF 418 is input to adder 410. Adder 410 has received the constant data of $2^{n-1}$ from $2^{n-1}$ generator 419. The output signal of D-type FF 418 is applied to output terminal 420, from which it is output as the output signal of the digital PLL circuit under discussion. A circuit section consisting of subtractor 414, K-multiplier 415, AND gate 416 corresponds to the phase comparator and the loop filter of the analog PLL circuit. Another circuit section consisting of adders 410 and 417, D-FF 418 and $2^{n-1}$ generator 419 corresponds to the voltage controlled oscillator whose phase control operation is performed according to the input signal to adder 417. Sampling clock generator 402 generates a clock signal and applied it to D-type FFs 403, 406, 407, 412, 413, and 418, and low-pass filter 411.

Figure 10:
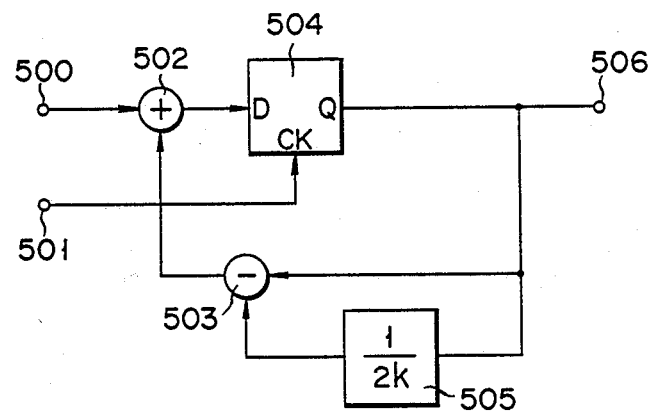
FIG. 10 shows a block diagram showing the detail of a part of the FIG. 9 circuit.

A specific circuit configuration of low-pass filter 411 in FIG. 9 is illustrated in FIG. 10. The illustrated low-pass filter 411 is a leak integrator.

The output data from adder 409 (FIG. 9) is applied to input terminal 500. A clock signal derived from sampling clock generator 402 (FIG. 9) is applied to another input terminal 501. The input data at input terminal 500 is applied to adder 50 and is added to the output data of subtractor 503 in adder 502 The addition result is applied to D-type FF 504. The output data of D-type FF 504 is applied to both adder 503 and multiplier 505. This multiplier multiplies the output data of D-type FF 504 by $\frac{1}{2}k$ (k is a positive integer) by bit shifting the output data of D-type FF 504. Subtractor 503 subtracts the output data of multiplier 505 from the output data of D-type FF 504. In the leak integrator thus arranged, the output data of D-type FF 504 is supplied to output terminal 506, and is then to adder 408 in FIG. 9.

In the digital PLL circuit of the third embodiment, the low frequency components of the phase error, which may cause the stationary phase error is removed by a group of adder 408, subtractor 409 and low-pass filter 211, which is outside a phase locked loop made up of subtractor 214, multiplier 415, AND gate 416, adders 410 and 417, D-type FF 418, and $2^{n-1}$ generator 419. Thus, the low frequency error in the phase of the input signal is corrected before the input signal enters the PLL. This results in reducing the stationary phase error. For the high frequency components of the phase error, the PLL including the multiplier 415 as the conventional simple loop filter functions, to thereby keep good performances of the PLL circuit. Thus, the digital PLL circuit of FIG. 9 may reduce the stationary phase error, while keeping the high operating frequency.

While two successive sampling points are used for calculating the average phase, three or more sampling points may be used for the same purposes, if necessary. In this case, the PLL circuit may be operated at a high speed.

As seen from the foregoing, in the digital PLL circuit, the low frequency components of the phase error, which may cause the stationary phase error, is worked out in the circuitry outside the PLL. The phase of the input signal is corrected by the calculated low frequency components. Then, the phase corrected input signal is entered to the PLL. Therefore, the stationary phase error may be reduced without impairing the operating frequency of the PLL circuit.

It is evident that a combination of the first and second embodiments of the present invention may be within the scope of the present invention.

Figure 11:
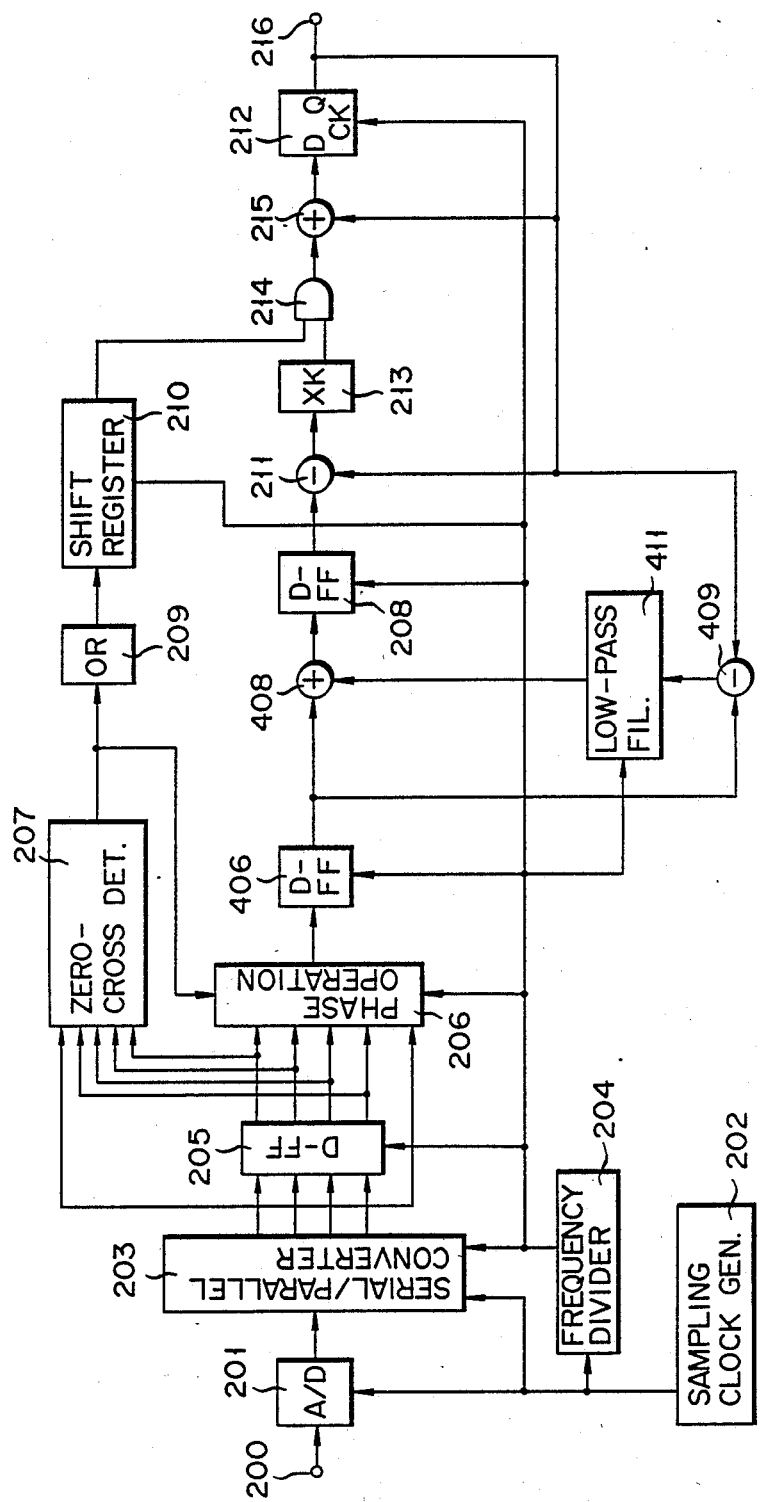
FIG. 11 shows a block diagram showing a configuration of a digital phase locked loop circuit according to a fourth embodiment of the present invention.

A circuit arrangement of FIG. 11 is a specific example of that combination. This will be described as a digital PLL circuit according to a fourth embodiment of the present invention. In FIG. 11, like reference numerals are used for designating like portions in FIGS. 3 and 9. The FIG. 11 circuit arrangement corresponds to the FIG. 3 circuit arrangement with an additional circuitry including D-type FF 406, adder 408, subtractor 409, and low-pass filter 411.

Figure 12:
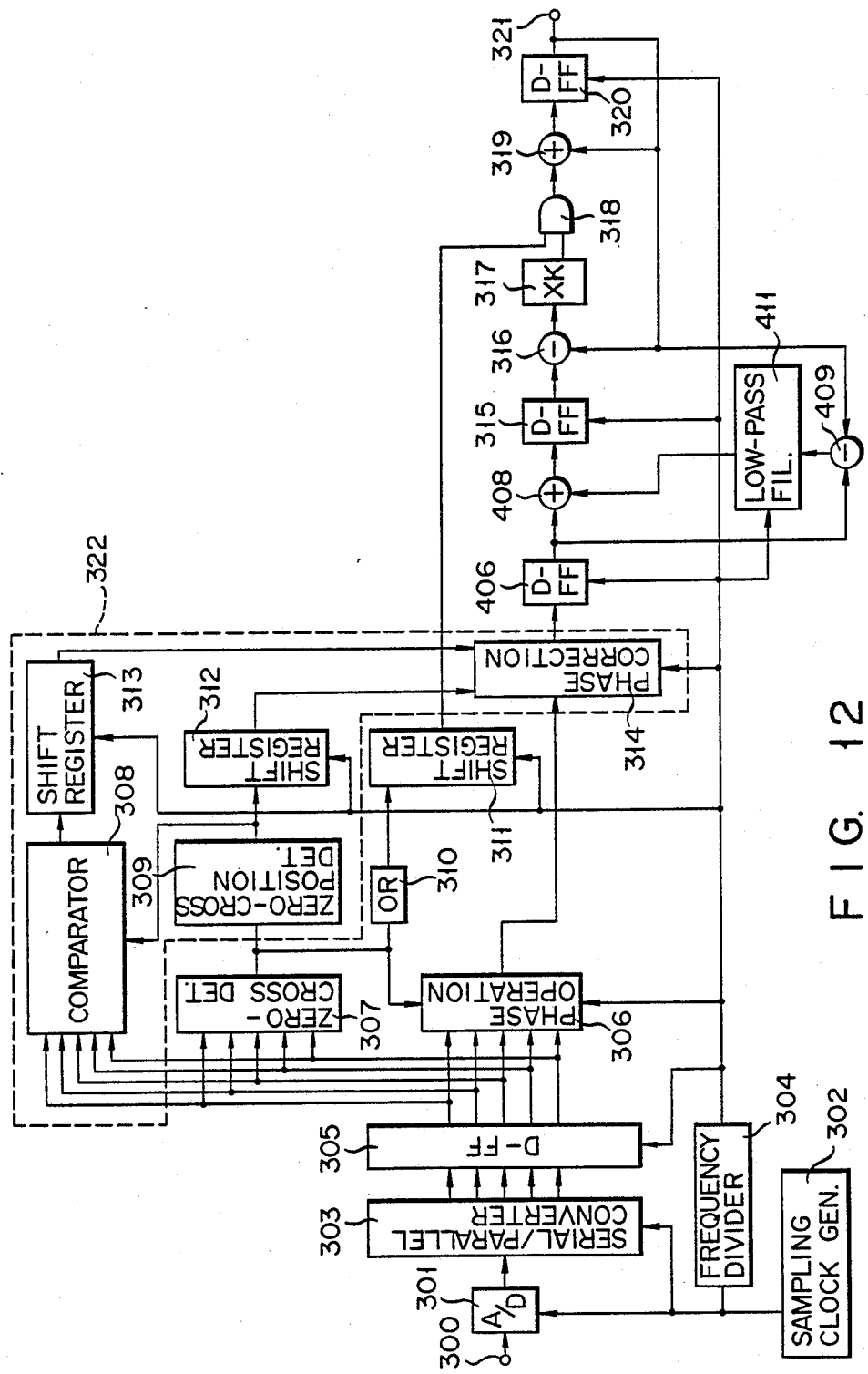
FIG. 12 shows a block diagram showing a configuration of a digital phase locked loop circuit according to a fifth embodiment of the present invention.

A combination of the third and second embodiments is illustrated in FIG. 12 as a fifth embodiment of a digital PLL circuit according to the present invention. In FIG. 12, like reference numerals are used for designating like portions in FIGS. 6 and 9. The FIG. 12 circuit arrangement corresponds to the FIG. 6 circuit arrangement with an additional circuitry including D-type FF 406, adder 408, subtractor 409, and low-pass filter 411.

The serial-to-parallel conversion may be performed after the zero cross detection and the phase calculation, as in the sixth and seventh embodiments mentioned below.

Figure 13:
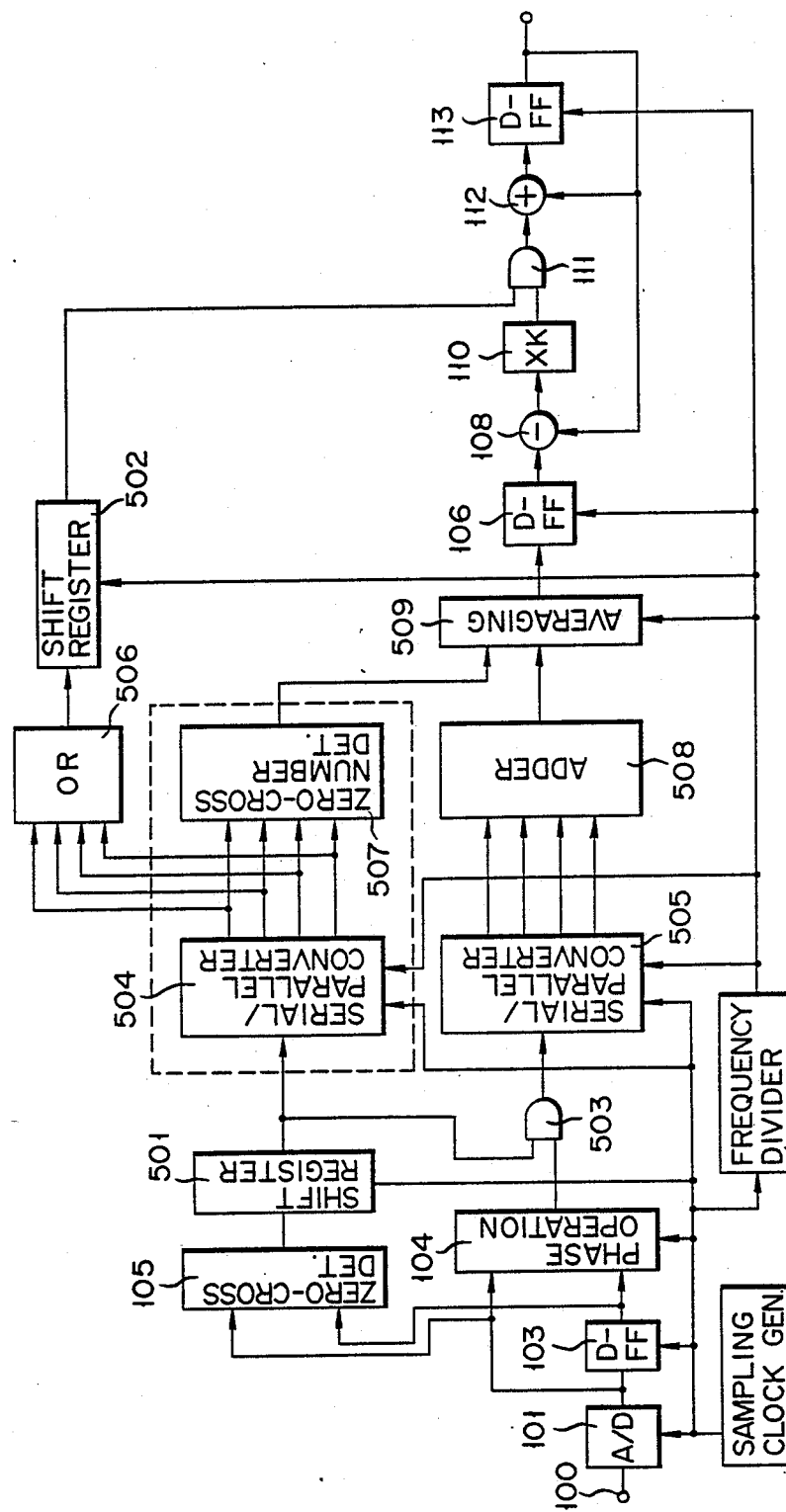
FIG. 13 shows a block diagram showing a configuration of a digital phase locked loop circuit according to a sixth embodiment of the present invention.

FIG. 13 shows the circuit arrangement according to the sixth embodiment of the present invention. This circuit arrangement is similar to that shown in FIG. 1, except that it includes a circuit portion comprising: shift registers 501 and 502, AND gate 503, serial-to parallel converters 504 and 505, OR circuit 506, zero cross number detector 507, adder 508, averaging circuit 509, and frequency divider 510.

Figure 14:
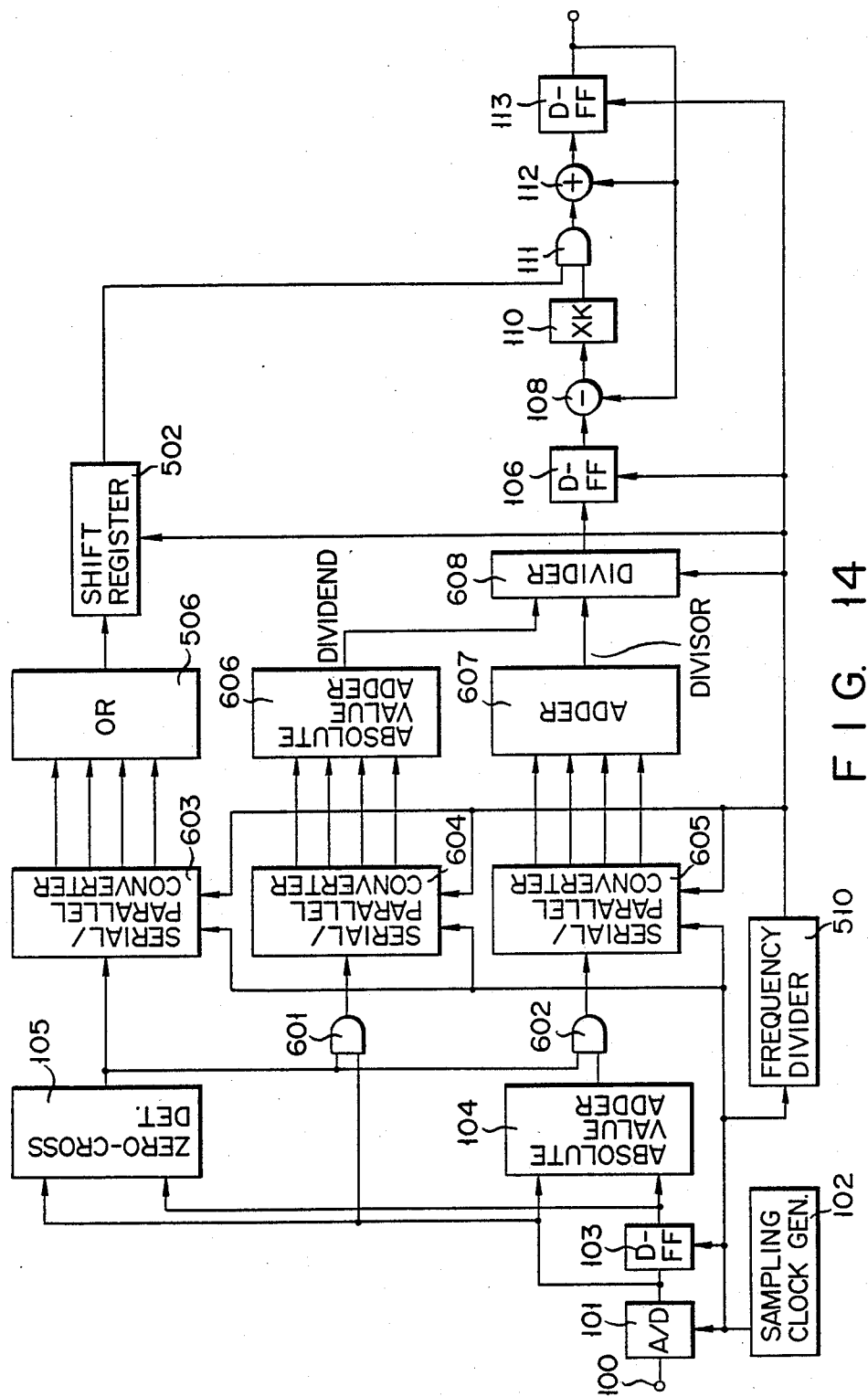
FIG. 14 shows a block diagram showing a configuration of a digital phase locked loop circuit according to a seventh embodiment of the present invention.

FIG. 14 shows the circuit arrangement according to the seventh embodiment of the present invention. This circuit arrangement is similar to that shown in FIG. 13, except that it includes a circuit portion comprising: AND gates 601 and 602, serial-to-parallel converters 603–605, absolute value adder 606, adder 607, and divider 608.

What is claimed is:

1. A digital phase locked loop circuit comprising:
sampling means for sampling a reproduced analog signal of a digital signal at a sampling frequency higher than a bit rate of a transmission channel;
operation means for arithmetically operating, by using data at three or more successive sampling points, an average phase of a point where the reproduced signal crosses a reference level relative to a predetermined sampling point, during a period of a plurality of sampling intervals defined by said successive sampling points; and
phase locked loop means for generating a signal whose phase is locked at the clock signal of the transmission channel by using the average phase output from said operation means.

2. The phase locked loop circuit according to claim 1, in which said operation means includes adding means for obtaining a first value by adding the sums of the absolute values of the data at the sampling points located at both ends of the sampling interval including the reference level cross point, and further obtaining a second value by adding the absolute values each at one of the sampling points at both ends of the sampling interval including the reference level cross point, over a time period consisting of the plurality of sampling intervals, and dividing means for obtaining a ratio of said first and second values.

3. The phase locked loop circuit according to claim 1, in which said operation means includes averaging means for obtaining a first value by averaging the sums of the absolute values of the data at the sampling points located at both ends of the sampling interval including the reference level cross point, and further obtaining a second value by averaging the absolute values each at one of the sampling points at both ends of the sampling interval including the reference level cross point, over a time period consisting of the plurality of sampling intervals, and dividing means for obtaining a ratio of said first and second values.

4. The phase locked loop circuit according to claim 1, in which said operation means includes a correcting means for correcting the operation result of the average phase for the sampling points relating to the reference level cross point for the successive sampling intervals.

5. The phase locked loop circuit according to claim 4, in which said correcting means includes a means for obtaining the position and the number of the sampling interval including the reference level cross point, and make the correction of the operation result of the average phase on the basis of the obtained position and number of the sampling interval including the reference level cross point.

6. The phase locked loop circuit according to claim 4, in which said correcting means includes a means for making the correction of the operation result on the basis of the values at the sampling point located at both sides of the sampling interval including the reference level cross point.

7. The phase locked loop circuit according to claim 4, in which said correcting means includes a means for obtaining the position and the number of the sampling interval including the reference level cross point, and make the correction of the operation result of the average phase on the basis of the obtained position and number of the sampling interval including the reference level cross point, and further the values at the sampling point located at both sides of the sampling interval including the reference level cross point.

8. A digital phase locked loop circuit comprising:
sampling means for sampling a reproduced analog signal of a digital signal at a sampling frequency higher than the bit rate of a transmission channel;
operation means for arithmetically operating, by using data at a plurality of successive sampling points, an average phase of a point where the reproduced signal crosses a reference level relative to a predetermined sampling point, for a time period defined by successive sampling points;
phase locked loop means for generating a signal whose phase is locked at the clock signal of the transmission channel by using the average phase output from said operation means;
phase error detecting means located outside a phase locked loop by said phase locked loop and for obtaining the low frequency components of the phase error on the basis of the operation result by said operation means; and
error correction means for correcting the phase of an input signal to said phase locked loop means by using the low frequency component of phase error derived from said phase error correcting means.

9. The phase locked loop circuit according to claim 8, in which said phase error detecting means includes a low-pass filter means for picking up the low frequency component of the operation result by said operation means.

10. The phase locked loop circuit according to claim 8, in which said low-pass filter means includes a leak integrating means.

11. The phase locked loop circuit according to claim 8, in which said operation means uses three or more successive sampling points.

12. The phase locked loop circuit according to claim 11, in which said operation means includes adding means for obtaining a first value by adding the sums of the absolute values of the data at the sampling points located at both ends of the sampling interval including the reference level cross point, and further obtaining a second value by adding the absolute values each at one of the sampling points at both ends of the sampling interval including the reference level cross point, over a time period consisting of the plurality of sampling intervals, and dividing means for obtaining a ratio of said first and second values.

13. The phase locked loop circuit according to claim 11, in which said operation means includes averaging means for obtaining a first value by averaging the sum of the absolute values of the data at the sampling points located at both ends of the sampling interval including the reference level cross point, and further obtaining a second value by averaging the absolute values each at one of the sampling points at both ends of the sampling interval including the reference level cross point, over a time period consisting of the plurality of sampling intervals, and dividing means for obtaining a ratio of said first and second values.

14. The phase locked loop circuit according to claim 11, in which said operation means includes a correcting means for correcting the operation result of the average phase for the sampling points relating to the reference level cross point for the successive sampling intervals.

15. The phase locked loop circuit according to claim 14, in which said correcting means includes a means for obtaining the position and the number of the sampling interval including the reference level cross point, and make the correction of the operation result of the average phase on the basis of the obtained position and number of the sampling interval including the reference level cross point.

16. The phase locked loop circuit according to claim 14, in which said correcting means includes a means for making the correction of the operation result on the basis of the values at the sampling point located at both sides of the sampling interval including the reference level cross point.

17. The phase locked loop circuit according to claim 14, in which said correcting means includes a means for obtaining the position and the number of the sampling interval including the reference level cross point, and make the correction of the operation result of the average phase on the basis of the obtained position and number of the sampling interval including the reference level cross point, and further the values at the sampling point located at both sides of the sampling interval including the reference level cross point.

18. A digital phase locked loop circuit comprising:
sampling means for sampling a reproduced analog signal of a digital signal at a sampling frequency higher than a bit rate of a transmission channel;
first operation means for obtaining a phase difference between a point where the reproduced analog signal crosses a reference level and a predetermined sampling point, in an interval between two successive sampling points;
second operation means for obtaining an average of the phase differences obtained by said first operation means; and
phase lock loop means for generating a signal whose phase is locked at the clock signal of the transmission channel by using the average obtained by said second operating means.

19. A digital phase locked loop circuit comprising:
sampling means for sampling a reproduced analog signal of a digital signal at a sampling frequency higher than a bit rate of a transmission channel;
operation means for obtaining a phase of a point where the reproduced signal crosses a reference level relative to a predetermined sampling point when the reproduced analog signal crosses the reference level at one point, and for obtaining an average phase of points where the reproduced analog signal crosses the reference level relative to each predetermined sampling point when the reproduced analog signal crosses the reference level at a plurality of points, said operation means obtaining the phase or average phase in an interval between successive three or more sampling points; and
phase lock loop means for generating a signal whose phase is locked at the clock signal of the transmission channel by using data obtained by said operating means.

* * * * *